United States Patent [19]
Bakewell

[11] 4,415,403
[45] Nov. 15, 1983

[54] METHOD OF FABRICATING AN ELECTROSTATIC PRINT HEAD

[75] Inventor: Joseph J. Bakewell, Boxford, Mass.

[73] Assignee: Dynamics Research Corporation, Wilmington, Mass.

[21] Appl. No.: 214,463

[22] Filed: Dec. 8, 1980

Related U.S. Application Data

[63] Continuation-in-part of Ser. No. 962,193, Nov. 20, 1978, abandoned.

[51] Int. Cl.³ .......................... C23F 1/02; B44C 1/22; G01D 15/06
[52] U.S. Cl. .................................. 156/634; 156/644; 156/652; 156/656; 156/659.1; 156/901; 346/155
[58] Field of Search ............... 346/153, 154, 155, 156, 346/139 C; 430/312, 313, 318; 427/97; 156/629–634, 650–652, 656, 659.1, 661.1, 901, 902, 644; 174/68.5; 29/603

[56] References Cited

U.S. PATENT DOCUMENTS

| | | | |
|---|---|---|---|
| 3,725,950 | 4/1973 | Lamb | 346/154 |
| 3,903,594 | 9/1975 | Koneval | 346/155 X |
| 3,962,002 | 6/1976 | Finkbeiner et al. | 156/661.1 X |
| 4,287,525 | 9/1981 | Tagawa | 346/155 |

*Primary Examiner*—William A. Powell
*Attorney, Agent, or Firm*—Weingarten, Schurgin, Gagnebin & Hayes

[57] ABSTRACT

An electrostatic print head and method of fabrication therefor in which a head is provided having a precision high resolution array of styli of intended cross-section and an interconnect pattern for simple connection to driving circuits. A planar thin film pattern of spaced metal electrode lines is provided by photolithographic and electroforming techniques on one surface of a glass or ceramic substrate, and a spaced array of planar thin film buss lines are similarly formed on the opposite surface. The electrode lines and buss lines are formed by vacuum deposition of a metal onto the substrate surfaces, etching into intended patterns, and electroforming to the required thickness and cross-sections. Electronic components can be provided in film form on the same substrate as the electrode lines.

10 Claims, 9 Drawing Figures

METHOD OF FABRICATING AN ELECTROSTATIC PRINT HEAD

RELATED APPLICATION

This application is a continuation-in-part of copending application Ser. No. 962,193 filed Nov. 20, 1978, and now abandoned.

FIELD OF THE INVENTION

This invention relates to electrostatic printing and more particularly to an electrostatic print head and method of fabrication.

BACKGROUND OF THE INVENTION

In electrostatic printing and plotting systems, there is provided a print head which includes an array of electrodes which can be brought into close proximity with a writing surface and, when electrically energized, cause a charge pattern on the surface to which a toner can be applied to produce a visible image in the shape of the charge pattern. The print heads are often in the form of one or more rows of electrodes terminating in nibs or styli and retained in a support member, the styli being closely spaced to produce an effectively continuous print on an associated surface. Typically, 200 styli per inch are provided for graphic plotters.

Such print head have been fabricated by hand-wiring of an array of wires, the ends of which form the styli, as shown, for example, in U.S. Pat. No. 3,693,185. Another known technique of electrostatic print head fabrication is by printed circuit techniques such as shown in U.S. Pat. Nos. 3,267,485 and 3,718,936. Fabrication of a print head by hand-wiring is necessarily time-consuming, requires skilled labor, and is usually expensive and inefficient for quantity manufacture. Printed circuit fabrication techniques have not been wholly satisfactory in producing high performance print heads heretofore, as the production of high density styli without breaks or short circuits is extremely difficult using printed circuit materials and fabrication processes. Moreover, interconnection of electrode lines to the addressing network has been complicated and unreliable. In addition, the shape of the styli at the writing surface is preferably of square cross-section which is difficult to attain using plating or etching types of printed circuit processes.

In the fabrication of an electrostatic print head by printed circuit techniques, the achievable resolution is limited by the printed circuit board material, by reason of its relatively rough surface and the manner in which metal surfaces are formed on the printed circuit substrate board. Usually copper or other metal foil is adhesively secured to the printed circuit board substrate. Thus, a printed circuit board usually includes conductive foil adhered to the substrate surface by a layer of adhesive, and this structure cannot provide a very smooth or good surface. In addition, in printed circuit board technology, holes are not provided in the substrate until after lamination of the metal foil onto the substrate, since holes, if previously formed, would interfere with the lamination of the foil onto the substrate surface. Thus, printed circuit fabrication techniques require that conductive foil be provided on the substrate surfaces and holes thereafter formed through the substrate, with a conductive interconnection thereafter being provided in the holes to interconnect the top and bottom conductive surfaces. Such a conductive connection to the conductive board surfaces is subject to discontinuities and cannot provide a continuous conductive layer.

Another printed circuit fabrication technique is shown in U.S. Pat. No. 3,771,634, wherein a printed circuit board has holes drilled therethrough and then plated to form conductive interconnections between the upper and lower conductive surfaces. Alternative fabrication is suggested, employing a ceramic substrate, with the printed circuit techniques described.

SUMMARY OF THE INVENTION

Briefly, the present invention provides an electrostatic print head fabricated by use of photolithographic and electroforming techniques on a glass or ceramic substrate to achieve a head construction having a precision, high resolution array of styli of intended cross-section and having an interconnect pattern for simple connection to driving circuits. In accordance with the invention, a planar thin film pattern of spaced metal electrode lines is formed on one surface of a glass or ceramic substrate, and a spaced array of planar thin film buss lines are formed on the opposite substrate surface. Each of the electrode lines includes an enlarged pad area which is in alignment or registration with a corresponding pad area of a respective one of the buss lines. The registered pad areas are conductively interconnected such that each electrode line is in electrical connection with an associated buss line. The electrode lines are formed by photolithographic techniques by which evaporated metal is deposited on the substrate surface and then electroformed and etched in the intended pattern. The buss lines are similarly formed. The electrode lines thus formed are of high resolution having styli or nib ends which are of precisely configured cross-sectional shape and dimensions. Typically, a pair of planar thin film patterns are employed in a single print head to provide a double row of styli which are in staggered relationship to each other.

In accordance with the novel method for fabricating an electrostatic print head, a substrate, preferably of glass, has holes photoetched or otherwise provided therethrough at predetermined positions. Both surfaces of the substrate have a metal vacuum deposited thereon, the deposited metal extending into the previously formed holes to coat the hole surfaces with the metal for purposes of electrically interconnecting the metal-coated substrate surfaces. The vacuum deposited metal is typically chromium overlayed with copper. After the vacuum deposition of chromium and copper, a thin layer of metal, typically copper, is electroplated over the chromium copper surfaces of the substrate and the metal-coated holes. A photoresist pattern is then formed on one surface of the substrate to provide an intended array of electrode lines and pad areas in alignment with respective pad areas of the electrode array.

A layer of nickel is electroplated onto all exposed copper surfaces of the substrate. Preferably, a layer of gold is then electroplated onto the connector areas of the buss lines by which the head is connected to a signal source to enhance the conductivity of the connector areas. The styli ends of the electrode lines are then electroformed to an intended cross-sectional shape and size. The photoresist material is removed by use of an appropriate solvent, and with the nickel plating serving as a resist material, the copper and chromium are selectively etched away to produce the resulting pattern of electrode lines and pad areas on one substrate surface, and buss lines and aligned pad areas on the opposite substrate surface.

The structure thus formed is then conformal coated with a plastic material and assembled into a completed head. If desired, the styli faces can be ground and finished to intended surface finish. The styli are disposed along an edge of the substrate to provide an array of styli in a position to contact a writing surface when the print head is in use. One end of the buss line array includes the connector areas adapted for connection to an electrical source operative to selectively apply energizing signals to the buss lines and thence to the associated electrode lines for producing an intended electrostatic charge pattern via the styli on the writing surface. The charge pattern is rendered visible by subsequent application of a toner to the pattern in a manner well-known in the art.

The glass or ceramic substrate provides a surface which is substantially superior in smoothness and continuity than printed circuit board materials. Metal is vacuum deposited on the substrate surface and onto surfaces of the holes through the substrate to provide a continuous conductive layer which is intimately adhered directly to the substrate and having the same smooth surface characteristics as the substrate surface. Resolution achievable by the present invention is greater than 200 lines per inch such that, at minimum, the resolution can be twice as fine by use of the invention than by conventional printed circuit techniques, where the resolution is generally limited to about 100 lines per inch or less.

DESCRIPTION OF THE DRAWINGS

The invention will be more fully understood from the following detailed description taken in conjunction with the accompanying drawings in which.

DETAILED DESCRIPTION OF THE INVENTION

Figure 1:
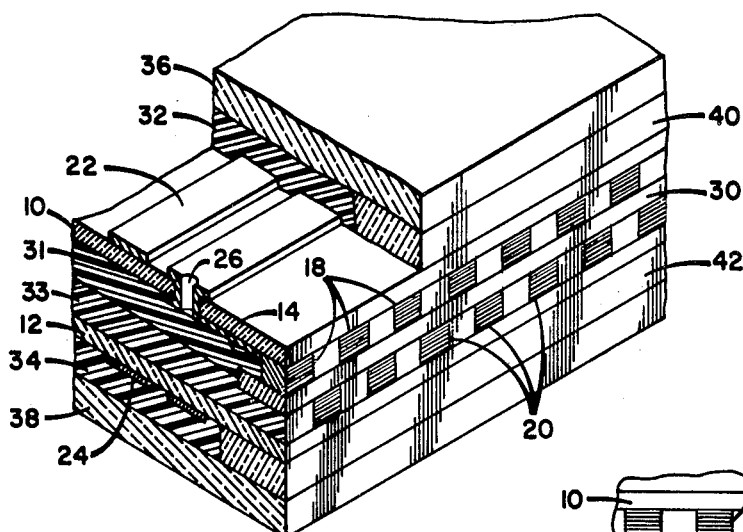
FIG. 1 is a cutaway pictorial view of a portion of an electrostatic head according to the invention.
Figure 2:
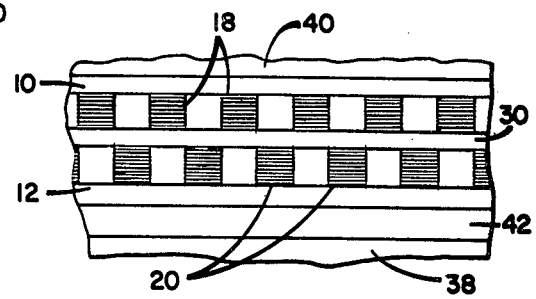
FIG. 2 is a cutaway elevation view at the writing end of a print head according to the invention.

An electrostatic print head according to the invention is shown in preferred embodiment in FIGS. 1 and 2 and includes first and second glass substrates 10 and 12, each having on one surface thereof a respective array of electrode lines 14 and terminating in a respective pattern of styli 18 and 20. Each substrate includes a spaced array of buss lines 22 and 24, respectively, on an opposite surface and selectively interconnected to the electrode lines by respective plated-through holes 26. The substrates 10 and 12 are spaced from one another by interposed layers 31 and 33 of plastic or other electrically insulative material. A glass or other insulative plate 30 separates the arrays of styli 18 and 20. Plastic layers 32 and 34 are provided over the respective buss arrays, and outer glass plates 36 and 38 are disposed over the laminated structure, along with glass spacers 40 and 42 provided along the writing face of the print head. This structure can be housed within any convenient head assembly for mounting in an electrostatic printer.

It will be appreciated that a print head can be constructed according to the principles of the invention employing one or more arrays of electrodes. For many purposes, a single array of electrodes is fully adequate. For other purposes, the illustrated staggered arrangement of two electrode arrays is preferably, while for yet other purposes, more than two electrode arrays can be provided. A description follows of the fabrication of the electrode lines and buss lines on glass substrate 10 of the embodiment of FIG. 1. It is understood that substrate 12 is fabricated in like manner.

Figure 3:
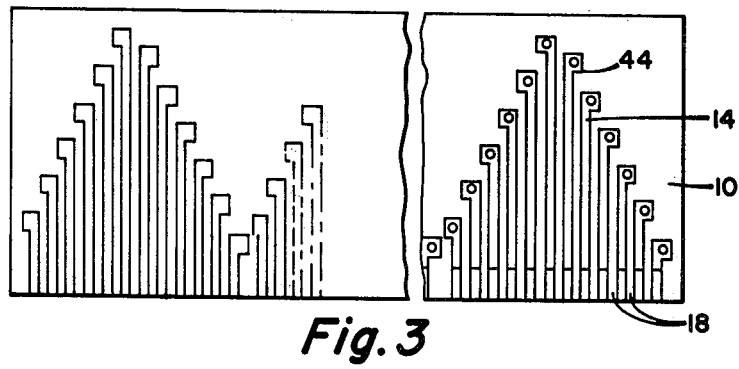
FIG. 3 is a plan view of the electrode lines and pad areas on one substrate surface.
Figure 4:
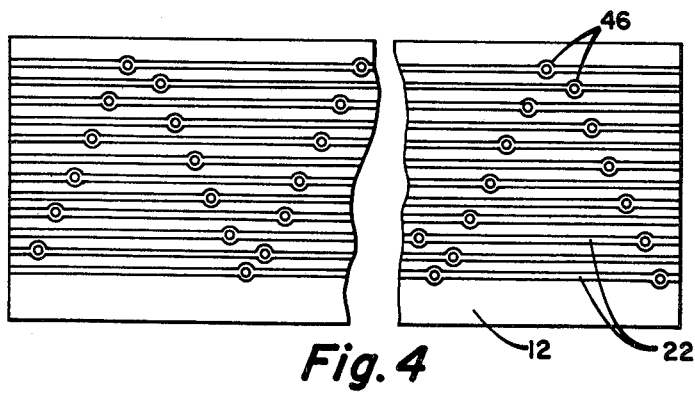
FIG. 4 is a plan view of the buss lines and pad areas on the opposite substrate surface.
Figure 5:
FIG. 5 is a sectional elevation view of the substrate containing the electrode lines and buss lines on respective opposite surfaces.

Referring to FIG. 3, there is shown a glass substrate 10 having formed on one surface thereof a parallel spaced array of metal electrode lines 14. The lines of the array all terminate at one end at one edge of the substrate to provide styli 18, and at the other end terminate in a staggered manner at respective enlarged pad areas 44. On the opposite surface of substrate 10, shown in FIG. 4, a spaced parallel array of buss lines 22 is formed extending in a direction transverse to the direction along which the electrode lines 14 extend. Each of the buss lines 22 includes an enlarged pad area 46 in alignment with the pad area 44 of a respective electrode line 14, and a plated-through connection 26 (FIG. 5) is provided through the substrate to electrically interconnect each buss line with a respective electrode line.

The electrode lines and buss lines are formed by thin film metal deposition, etching and electroforming techniques to provide line patterns of very high definition, each line being of uniform composition with no breaks or cracks to impair electrical conductivity. Very high resolution is also achieved by use of the novel process. Typically, line densities of at least 200 lines per inch can be provided. After formation of the electrode lines and buss lines on the respective surfaces of the glass substrate, the writing ends of the electrode lines are plated to an intended thickness and cross-section to form the writing styli 18 and 20. Typically, the electrode lines are plated to a square cross-section, although other cross-sectional configurations can also be provided.

The substrate having the electrode and buss patterns is fabricated in the following manner. The glass substrate 10 has holes photoetched or otherwise provided therethrough at predetermined positions at which aligned pad areas 44 and 46 will be formed. A metal is vacuum deposited onto both surfaces of the substrate and onto the walls of the previously formed holes through the substrate. The metal is typically chromium which provides good adherence to the glass surfaces, overlayed with a thin layer of copper. A thin layer of copper is then electroplated over the chromium and copper substrate surfaces and holes. A photoresist pattern is formed and processed by well-known techniques on one surface of the substrate to produce the array of electrode lines 14 and pad areas 44. A photoresist pattern is also provided on the opposite substrate surface to produce the pattern of buss lines 22 and pad areas 46. The exposed copper surfaces defined by means of the photoresist patterns are electroplated with a layer of nickel. The connector areas of the buss lines 22 can be gold-plated to provide high conductivity electrical contacts.

The ends of the electrode lines 14 providing the styli 18 are then masked and electroplated with nickel to an intended cross-sectional shape and size. The photoresist material is then removed by an appropriate solvent, and the copper and chromium, which were previously covered by the resist patterns, are selectively etched away to leave the nickel-plated patterns of electrode lines on one substrate surface and buss lines on the opposite substrate surface.

To assemble the thus formed structure into a print head as in FIG. 1, a conformal coating of plastic material is provided over both substrate surfaces to produce a plate containing the electrode and buss lines which is then assembled into the laminated head structure. The styli can be ground to an intended surface finish if desired. The connector areas of the substrate can be constructed for connection to external driving circuitry after complete assembly of the head, or can be constructed for connection to driving circuitry or interconnecting wiring during the final assembly of the head.

Figure 6:
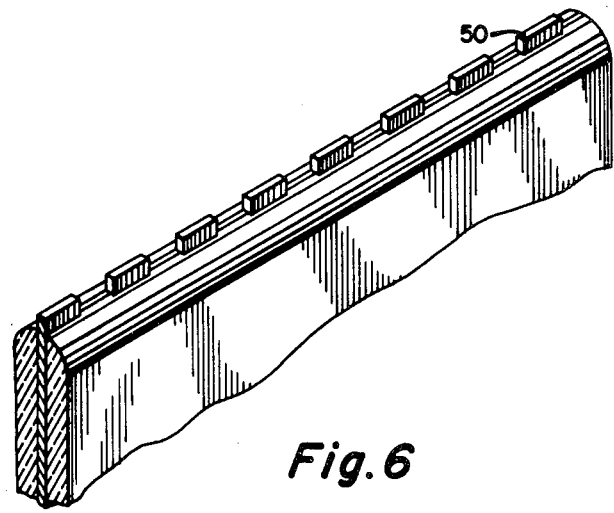
FIG. 6 is a cutaway pictorial view of an alternative embodiment of the invention.

An alternative embodiment is shown in FIG. 6 wherein the styli 50 extend beyond the surface of the head, rather than being substantially flush with the head surface as in the embodiments described above. The shape and extent of protrusion of the styli can be provided by plating the styli to the intended final shape or by selective etching of the surrounding portions of the substrate. The protruding styli can be of a different metal from the metal employed in forming the electrode lines to provide intended electrical and mechanical properties.

Figure 7:
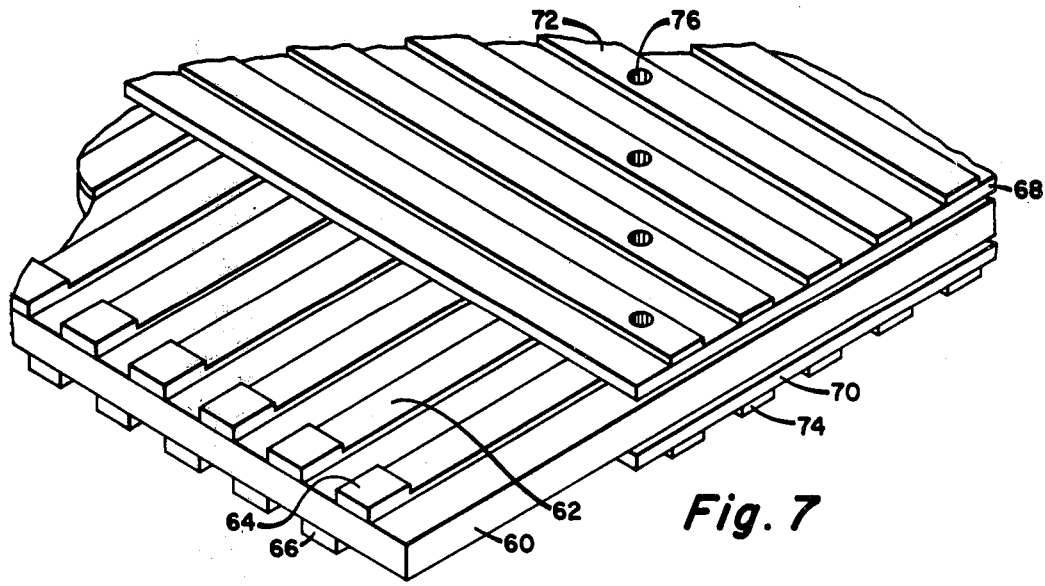
FIG. 7 is a cutaway pictorial view of a further embodiment of the invention.

A further embodiment of the invention is shown in FIG. 7 and includes a glass or ceramic substrate 60 having formed on one surface thereof an array of electrodes having ends formed as styli 64 of intended cross-sectional shape, as described above. A similar array of styli 66 and associated electrode lines is formed on the opposite surface of substrate 60, in intended relationship to the array 64. First and second electrically insulative substrates 68 and 60 are disposed as shown over the respective electrodes on the opposite surfaces of substrate 60. Each substrate 68 and 70 contains an array of buss lines 72 and 74, respectively, which extend along an axis transverse to the axis along which the electrode lines extend. The buss lines 72 and 74 are each connected such as via a plated-through hole 76 to associated electrode lines. Connection between the buss lines and the electrode lines can be made by reflow soldering, conductive plastic, welded or compression bonding, or other known electrical connection techniques.

Figure 8:
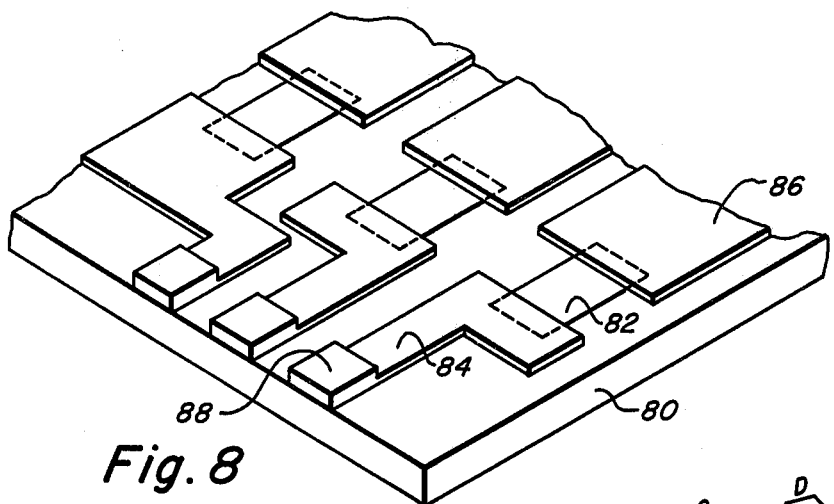
FIG. 8 is a cutaway pictorial view of yet another embodiment of the invention employing film resistors on the substrate in association with electrode lines and buss lines.

The use of a ceramic or glass substrate having smooth surface characteristics is employed to additional benefit in the embodiment of FIG. 8 wherein film resistors are deposited onto the substrate surface in association with the electrode and buss lines. Referring to FIG. 8, there is shown a ceramic substrate 80 having thin film resistors 82 vacuum deposited on a surface thereof and in electrical contact with the respective electrode lines 84 and respective buss lines 86, also vacuum deposited on the substrate surface. The electrode lines 84 terminate in styli 88 lying along an edge of the substrate 80 and which have been plated to an intended rectangular cross-section. The resistors 82 are formed of any thin film material providing the intended resistance. As an example, a mixture of silicon oxide and chromium can be employed. Electrically, the resistors limit the current which can be applied to the writing styli to prevent arcing from the styli across the writing surface, which can cause enlargement or destruction of the writing spots.

To form the resistors 82 on the substrate surface, the resistor areas are defined by a photoresist pattern on the substrate, and the resistive material is then vacuum deposited into the window areas in the photoresist layer, the deposition being to an intended thickness to provide the required sheet resistance. The photoresist pattern is then removed, and the conductive paths are thereafter formed in the manner described above.

Other electronic components can be vacuum formed or otherwise deposited on the ceramic substrate surface, and entire electronic film circuits can be provided in association with the electrode lines on the same substrate surface, since the ceramic or glass substrate material is capable of supporting high performance circuit paths. As an example, some or all of the driving circuit for the electrode array can be integrated onto the same substrate surface to provide an electrostatic print head with the driving circuits in close association with the writing styli.

Figure 9:
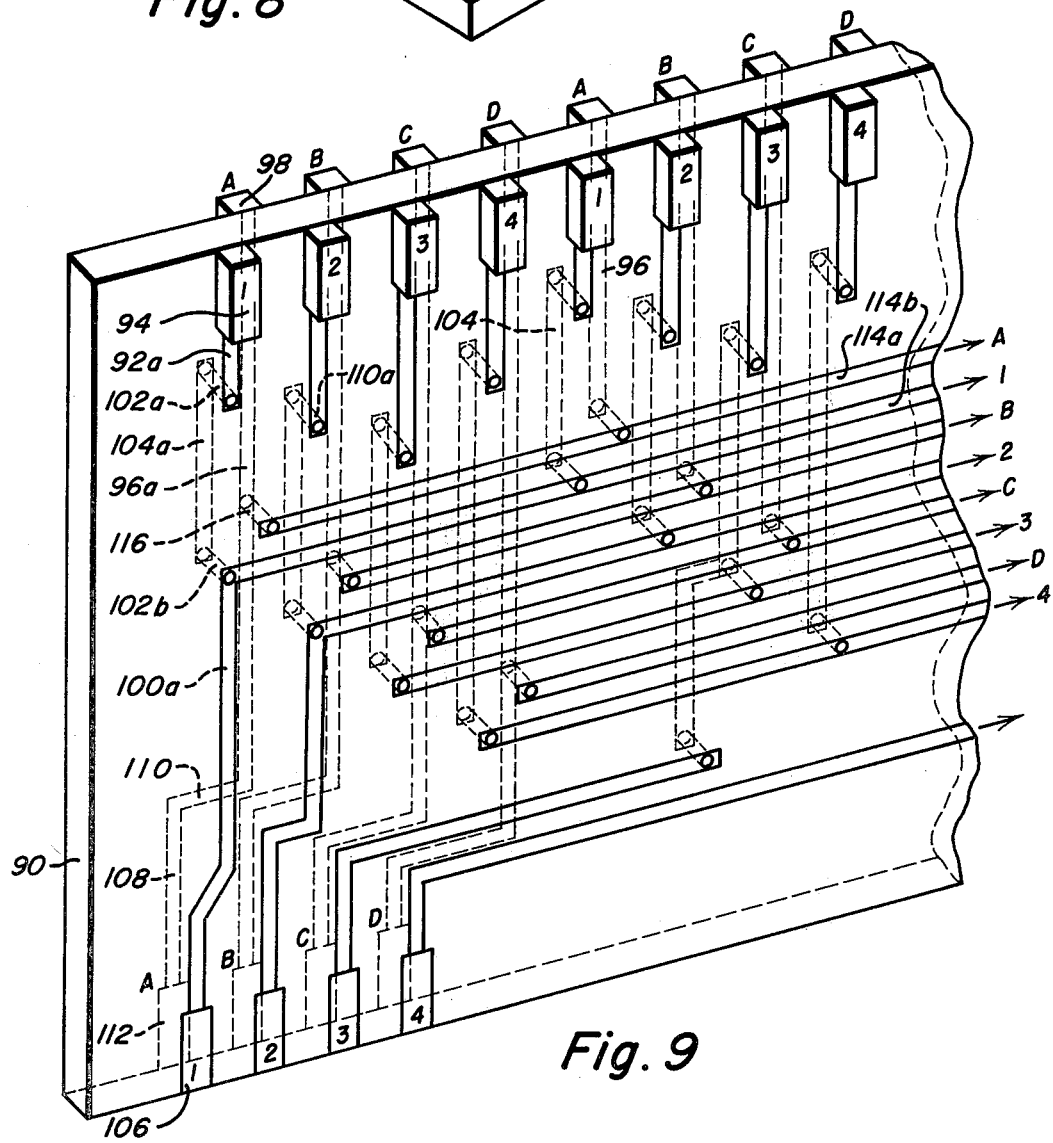
FIG. 9 is a cutaway pictorial view of another embodiment of the invention employing a double row of styli on the same substrate and with the buss lines also on the same substrate.

A further embodiment of the invention is shown in FIG. 9, wherein two arrays of styli are provided on the same substrate in association with the buss lines also on the same substrate. The substrate 90 includes on the upper surface an array of electrode lines 92 terminating in styli 94 disposed along an edge of the substrate. A similar array of electrode lines 96 is provided on the bottom substrate surface and terminating in styli 98, which are disposed along the same edge of the substrate as styli 94 and laterally spaced therefrom to be in staggered relationship. The styli 94 are arranged in groups of four labelled 1-4; the styli 98 are arranged in groups of four labelled A-O. An array of addressing lines 100 is provided on the upper substrate surface in electrical connection with respective styli 94 by means of plated-through holes in the substrate and interconnecting conductive paths 104 on the bottom substrate surface. The addressing lines 100 terminate in connector pads 106. As seen in FIG. 9, a plated-through hole 102a at the end of an electrode line 92a is connected to a conductive path 104 on the bottom substrate surface and which terminates in a plated-through hole 102b connected to an address line 100a. The other electrode lines 92 are similarly connected via respective plated-through holes and respective conductive paths to respective address lines 100. The array of electrode lines 96 on the other board surface is connected to respective address lines 108 via paths 110 on the bottom surface of the substrate. The address lines 108 terminate in connector pads 112.

The corresponding stylus of each group of styli is interconnected by respective buss lines. Thus, buss line 114a(A) is connected to the styli 98 labelled A by way of respective plated-through holes 116 and respective lines 96. The buss line 114b(1) is connected to the styli 94 labelled 1 via respective plated-through holes 102 and lines 104. The other buss connections are similarly made. As a result, the connector pads 106 are in connection with all correspondingly labelled styli 94, and pads 112 are in connection with all correspondingly labelled styli 98. Extremely dense packing of the conductive line can be achieved by the invention while retaining high conductivity and line definition.

The ceramic or glass substrate is provided with holes in intended position, and metal is then vacuum deposited onto both substrate surfaces and the walls of the substrate holes. The conductive patterns are then photoetched to provide the resulting electrode, addressing, and buss lines, and thereafter the writing styli can be plated to intended configurations as described. In this embodiment, the spacing and parallelism of the two rows of styli can be more easily and accurately controlled by the initial photolithographic steps which determine such spacing and phase relationship, than in the embodiment of FIG. 1 where the spacing and phasing between the two styli arrays is accomplished during the lamination stage. In general, this embodiment can be more economically fabricated than in the embodiments above requiring multiple substrates. On the other hand, a greater degree of control is often required in fabricating this embodiment of FIG. 9 by reason of the close spacing of conductive paths and through-holes in the single substrate.

It will be appreciated that the invention can be modified and alternatively implemented without departing from the spirit of the invention. Accordingly, it is not intended to limit the invention by what has been particularly shown and described, except as indicated in the appended claims.

What is claimed is:

1. The method of fabricating an electrostatic print head comprising the steps of:
   etching holes through a glass or ceramic substrate at predetermined positions;
   vacuum depositing a first metal layer on both surfaces of the substrate and onto the surfaces of the holes previously etched through the substrate to produce a uniform conductive layer intimately adhered directly to the substrate and having the same smooth surface characteristics as the substrate surface;
   electroplating a second metal layer on the surfaces of the first metal layer to produce a planar structure of uniform composition and thickness;
   forming a photoresist pattern on one surface of the second metal layer defining a high resolution array of electrode lines extending along a first direction, with the ends of the electrode lines lying along an edge of the substrate and defining a high resolution array of writing styli, and a pad area on each electrode line surrounding a respective one of the holes through the substrate;
   forming a photoresist pattern on the opposite surface of the second metal layer to define a high resolution array of buss lines extending along a transverse direction to the first direction, with a connector area on each of the buss lines and a pad area on each of the buss lines in registration with a pad area of a respective electrode line and surrounding a respective hole through the substrate;
   plating a third metal layer on all exposed surfaces of said second metal layer defined by the photoresist patterns to produce a multilayered metal structure of uniform thickness and conductivity;
   plating the styli of the electrode lines to intended precisely configured cross-sectional shape and size;
   removing the photoresist material from both surfaces of the substrate; and
   selectively etching the exposed first and second metal layers to leave the third metal electrode line and buss line patterns on respective substrate surfaces, the electrode lines and buss lines having high resolution and uniform composition without breaks or cracks.

2. The method of claim 1 wherein said first metal layer is chromium, said second metal layer is copper, and said third metal layer is nickel.

3. The method of claim 1 further including the step of plating a gold coating on the connector areas of the buss lines.

4. The method of fabricating an electrostatic print head comprising the steps of:
   etching holes through a glass or ceramic substrate at predetermined positions;
   vacuum depositing a metal layer on both surfaces of the substrate and onto the surfaces of the holes previously etched through the substrate to provide a conductive connection through the etched holes to produce a uniform conductive layer intimately adhered directly to the substrate and having the same smooth surface characteristics as the substrate surface;
   forming by photoetching and electroforming a high resolution array of electrode lines of electrically conductive material on one surface of the glass or ceramic substrate, each of the lines having uniform composition without breaks or cracks, the ends of the electrode lines lying along an edge of the substrate and defining a high resolution array of styli for contacting a writing surface, and a pad area on each electrode line surrounding a respective one of the holes through the substrate;
   forming by photoetching and electroforming a high resolution array of buss lines of electrically conductive material on the opposite surface of the substrate, each of the lines having uniform composition without breaks or cracks, and a pad area on each buss line in registration with a pad area of a respective electrode line and surrounding a respective hole through the substrate;
   plating the styli of the electrode lines to an intended precisely configured cross-sectional shape and size; and
   providing areas of the buss lines for connection to an electrical source for selectively applying signals to the buss lines and to associated electrode lines.

5. The method of fabricating an electrostatic print head comprising the steps of:
   vacuum depositing a metal layer on both surfaces of a glass or ceramic substrate to produce a uniform conductive layer intimately adhered directly to the substrate and having the same smooth surface characteristics as the substrate surface;
   forming by photoetching and electroforming a first high resolution array of electrode lines of electrically conductive material on one surface of the glass or ceramic substrate;
   forming by photoetching and electroforming a second high resolution array of electrode lines of electrically conductive material on the opposite surface of the substrate;
   the ends of the electrode lines of each array lying along an edge of the substrate and defining a high resolution array of styli for contacting a writing surface, the styli of the first array being in predetermined relationship with the styli of the second array;

plating the styli of the first and second arrays of electrode lines to an intended precisely configured cross-sectional shape and size;

providing a first high resolution array of buss lines on a second substrate which is disposed on said first array of electrode lines;

providing a second high resolution array of buss lines of a third substrate which is disposed on said second array of electrode lines; and connecting the buss lines of said first and second arrays of buss lines to associated electrode lines of said first and second arrays of electrode lines.

6. The method of fabricating an electrostatic print head comprising the steps of:

etching holes through a glass or ceramic substrate at predetermined positions;

vacuum depositing a first metal layer on both surfaces of the substrate and onto the surfaces of the holes previously etched through the substrate to produce a uniform conductive layer intimately adhered directly to the substrate and having the same smooth surface characteristics as the substrate surface;

forming a photoresist pattern on one surface of the first metal layer defining a high resolution array of electrode lines extending along a first direction, with the ends of the electrode lines lying along an edge of the substrate and defining a high resolution array of writing styli, and a pad area on each electrode line surrounding a respective one of the holes through the substrate;

forming a photoresist pattern on the opposite surface of the first metal layer to define a high resolution array of buss lines extending along a transverse direction to the first direction, with a connector area on each of the buss lines and a pad area on each of the buss lines in registration with a pad area of a respective electrode line and surrounding a respective hole through the substrate;

plating a second metal layer on all exposed surfaces of said first metal layer defined by the photoresist patterns;

plating the styli of the electrode lines to intended precisely configured cross-sectional shape and size;

removing the photoresist material from both surfaces of the substrate; and selectively etching the exposed first metal layer to leave the second metal electrode line and buss line patterns on respective substrate surfaces, the electrode lines and buss lines having high resolution and uniform composition without breaks or cracks.

7. The method of claim 6, further including the steps of:

providing on both surfaces of the thus formed structure an insulative material to provide a plate having flat upper and lower surfaces; and laminating two or more of such plates with the styli of each plate disposed in predetermined adjacent relation.

8. The method of claim 6 including the step of forming the styli to protrude beyond the confronting edge of the substrate.

9. The method of fabricating an electrostatic print head comprising the steps of:

etching holes through a glass or ceramic substrate at predetermined positions;

vacuum depositing a first metal layer on both surfaces of the substrate and onto the surfaces of the holes previously etched through the substrate to produce a uniform conductive layer intimately adhered directly to the substrate and having the same smooth surface characteristics as the substrate surface;

forming a photoresist pattern on one surface of the first metal layer defining a high resolution array of electrode lines extending along a first direction, with the ends of the electrode lines lying along an edge of the substrate and defining a high resolution array of writing styli, and a pad area on each electrode line surrounding a respective one of the holes through the substrate;

forming a photoresist pattern on the opposite surface of the first metal layer to define a high resolution array of buss lines extending along a transverse direction to the first direction, with a connector area of each of the buss lines and a pad area on each of the buss lines in registration with a pad area of a respective electrode line and surrounding a respective hole through the substrate;

plating a second metal layer on all exposed surfaces of said first metal layer defined by the photoresist patterns;

plating the styli of the electrode lines to intended precisely configured cross-sectional shape and size;

removing the photoresist material from both surfaces of the substrate; and selectively etching the exposed first metal layer to leave the second metal electrode line and buss line patterns on respective substrate surfaces, the electrode lines and buss lines having high resolution and uniform composition without breaks or cracks;

providing a conformal coating of non-conductive plastic material over both substrate surfaces to produce a plate having flat upper and lower surfaces;

placing two or more of such plates in laminated arrangement with the styli of each plate disposed in predetermined adjacent relation; and interposing an insulative spacer between adjacent plates to provide predetermined separation between the styli of the adjacent plates.

10. The method of claim 6 further including the step of forming film resistors on a surface of said substrate and in electrical contact with selected electrode and buss lines.

* * * * *